United States Patent [19]
Montreuil

[11] Patent Number: 5,960,044
[45] Date of Patent: Sep. 28, 1999

[54] APPARATUS AND METHOD FOR BLOCK PHASE ESTIMATION

[75] Inventor: Leo Montreuil, Atlanta, Ga.

[73] Assignee: Scientific-Atlanta, Inc., Norcross, Ga.

[21] Appl. No.: 08/749,025

[22] Filed: Nov. 14, 1996

[51] Int. Cl.$^6$ .................. H03D 1/24; H03D 3/00
[52] U.S. Cl. .......................... 375/322; 375/331
[58] Field of Search ................... 375/283, 280, 375/279, 329, 330, 331, 322; 327/141; 329/304

[56] References Cited

U.S. PATENT DOCUMENTS

| | | |
|---|---|---|
| 3,956,623 | 5/1976 | Clark et al. . |
| 4,885,757 | 12/1989 | Provence ................................. 375/340 |
| 4,961,206 | 10/1990 | Tomlinson et al. . |
| 5,001,424 | 3/1991 | Birgenbeier et al. ..................... 375/376 |
| 5,283,815 | 2/1994 | Chennakeshu et al. . |
| 5,303,269 | 4/1994 | Altes . |
| 5,311,545 | 5/1994 | Critchlow . |
| 5,375,140 | 12/1994 | Bustamante et al. . |
| 5,465,271 | 11/1995 | Hladik et al. . |
| 5,485,489 | 1/1996 | Chiba . |
| 5,491,724 | 2/1996 | Altes ........................................ 375/322 |
| 5,497,400 | 3/1996 | Carson et al. . |
| 5,499,273 | 3/1996 | Kull et al. . |
| 5,619,537 | 4/1997 | Altes ........................................ 375/322 |

OTHER PUBLICATIONS

Francis D. Natali and Moe Lwin, "The Block Phase Estimator", Feb. 1993, pp. 45–53.
IEEE Transactions On Communication, vol. COM–35, No. 9, Sep. 1987, pp. 972–976.

*Primary Examiner*—Chi H. Pham
*Assistant Examiner*—Bryan Webster
*Attorney, Agent, or Firm*—Kenneth M. Massaroni; Hubert J. Barnhardt, III; Kelly A. Gardner

[57] ABSTRACT

A block phase estimator include a phase averaging circuit. A first embodiment of the phase averaging circuit includes a phase differencing circuit coupled to an averager input, a first modulo circuit coupled to the phase differencing circuit, a filter coupled to the first modulo circuit, and a summation circuit having an positive input and a negative input, the positive input being coupled to the averager input, the negative input being coupled to the filter. The phase averaging circuit further includes a second modulo circuit coupled to the summation circuit. An alternative embodiment of the phase averaging circuit includes a delay line having a plurality of taps coupled to an averager input and a plurality of first subtractor circuits, a first input of each first subtractor circuit being coupled to the averager input, a second input of each first subtractor circuit being coupled to a corresponding tap of the plurality of taps. A plurality of first modulo circuits are coupled to the plurality of first subtractor circuits, each first modulo circuit being coupled to a corresponding first subtractor circuit. A summation circuit is coupled to all first modulo circuits, and a scaling circuit is coupled to the summation circuit. The phase averaging circuit further includes a second subtractor circuit, a first input of the second subtractor circuit being coupled to the averager input, a second input of the second subtractor circuit being coupled to the scaling circuit.

15 Claims, 8 Drawing Sheets

$V_i = I_i + jQ_i$

5,960,044

APPARATUS AND METHOD FOR BLOCK PHASE ESTIMATION

BACKGROUND OF THE INVENTION

1. Field of the Invention

The present invention relates to synchronous detectors using block phase estimators. In particular, the invention relates to a phase averager of a block phase estimator.

2. Description of Related Art

Differential demodulator technology is often selected for a burst demodulator. A differential demodulator locks on to the carrier instantly; however, it has degraded performance in presence of noise. A coherent demodulator, where the carrier is coherently regenerated using a filter or phase locked loop, will theoretically provide superior noise performance if the loop bandwidth is narrow relative to the symbol rate; however, it is comparatively slow to lock on to the carrier. In the case of a phase locked loop, the lock on time is further increased by a hang-up phenomenon.

A block phase estimator is an alternative to the phase locked loop. The block phase estimator provides performance similar to the phase lock loop but does not suffer from the hang-up phenomenon.

In FIG. 1, digital receiver 10 includes an antenna coupled to a receiver. The receiver's output from its IF final stage is provided to in-phase and quadrature mixers. A local oscillator, using a Hilbert ($\pi/2$) transformer, provides in-phase and quadrature phase reference signals to the mixers. The mixer outputs are analog in-phase signal I and analog quadrature phase signal Q. The voltage V at the output of the final IF stage is given by $$V = I + jQ,$$

where j is the complex operator. Analog signals I,Q are sampled in analog to digital converters, filtered, decimated and interpolated to produce digitally sampled signals $I_i$ and $Q_i$. The filter is preferably a Nyquest filter matched to the modulation expected. The decimator/interpolator down samples the samples from the analog to digital converter to the symbol rate and resamples the signal at the center of each symbol.

In operation, when the antenna receives a continuous wave signal at a fixed, non-varying frequency to which the oscillator is precisely tuned in frequency and synchronized in phase, the outputs $I_i$, $Q_i$ from digital receiver 10 do not vary with time. However, if the oscillator is tuned to a frequency other than the exact frequency of the signal being received, outputs $I_i$, $Q_i$ will vary with time. The phase of the filtered/decimated/interpolated voltage $V_i$ is represented by the arctangent of the ratio of $Q_i$ to $I_i$. This phase angle variation over time corresponds to the frequency difference between the oscillator's characteristic frequency and the frequency of the signal received at the antenna. Conventional phase-locked loop synchronous detectors measure this phase difference, filter the measured difference, and use this filtered phase difference to control the frequency of the local oscillator (i.e., a voltage controlled oscillator). However, the present invention relates to a block phase estimator as an alternative technology to phase-locked loops.

A constant frequency received by digital receiver 10 has little or no utility since it carries no information. In useful communication systems, signals received by the antenna include modulation. The present invention relates to a block phase estimator used in a decoder for decoding phase shift keying (PSK).

FIG. 2 is a graph depicting locations of voltage V from digital receiver 10 receiving a QPSK (quadrature phase shift keying) signal as received by both conventional decoders and a decoder according to the present invention. Signals $I_i$, $Q_i$ may be plotted on the graph of FIG. 2. In a QPSK signal, a symbol may take on one of four values depicted in FIG. 2 as $-135°, -45°, +45°, +135°$. The object of a decoder is to determine which phase is being transmitted during the duration of the symbol.

In FIG. 6, conventional decoder 60 includes block phase estimator 50, and block phase estimator 50 includes modulation removal circuit 20, averager 30 and phase corrector tracker 40.

FIG. 3 depicts modulation removal circuit 20. Modulation removal circuit 20 includes Cartesian to polar transformer 22, multiplier 24 and a polar to Cartesian transformer made from a cosine transformer 26 and a sine transformer 28. In FIG. 3, digital sample signals $I_i$, $Q_i$ from digital receiver 10 (FIG. 1) are converted to polar coordinates using an arctangent function to provide a phase estimate of the phase of the current sample. The phase estimate of the phase of the current sample is phase $\phi_i$. Multiplier 24 multiplies phase $\phi_i$ by M, where M is the number of phases encoded into the PSK signal. This provides a phase estimate of the current sample with modulation removed. For BPSK signals, M is 2; for QPSK signals, M is 4; for 8-PSK signals, M is 8; etc. FIG. 2 depicts four phases so that M would equal 4; however, M may advantageously be 8, 16, etc. The output of multiplier 24 is converted back into Cartesian coordinates by cosine transformer 26 and sine transformer 28 to provide signals $I_i'$, $Q_i'$. It should be noted here that the output of mulitplier 24 may include phase angles greater than $2\pi$ radians; however, transformers 26, 28 are cyclical in nature and the outputs of these transformers are uneffected by angles greater than $2\pi$ radians.

The operation of modulation removal circuit 20 is best understood in connection with FIG. 2. The four locations depicted in FIG. 2 as possible voltages from receiver 10 will become multiplied in multiplier 24 by four (4) since the signals depicted in FIG. 2 are quadrature PSK signals. For example, the 45° phase depicted in the first quadrant in FIG. 2, when multiplied by 4 becomes 180°. Similarly the -45° when multiplied by four becomes -180°. When multiplied by four, the 135° phase angle becomes 540° (i.e., 180°+360°). Similarly the -135° becomes -540°. Since cosine and sine transformers 26, 28 cyclically repeat, all phases output of multiplier 24 created from any one of the signal locations depicted in FIG. 2 will be interpreted as having a phase angle of 180°. Thus, modulation is removed by modulation removal circuit 20.

However, if the oscilator in FIG. 1 does not exactly replicate the frequency of the carrier signal received from the antenna, the constellation of four locations depicted in FIG. 2 will rotate with time, either counter clock wise or clock wise depending on the sign of the frequency deviation. It is this frequency deviation that is measured in the block phase estimator. If there is a small frequency deviation, the phase output of multiplier 24 will be different than 180°.

FIG. 4 depicts conventional averager 30 as having two separate averaging circuits 32. Each averaging circuit 32 provides average signals $I_{AVG}'$, $Q_{AVG}'$ by maintaining a moving average of the input signals $I_i'$ $Q_i'$. The averaging is carried out, preferably, over a duration of time corresponding to several symbols. The sampling rate of the A to D converters in FIG. 1 is higher than the symbol rate. For example, the analog to digital converters may provide four samples over a symbol duration, and averaging circuits 32 would average the values input to these circuits by adding the values from sixteen samples and dividing by sixteen or scaling appropriately (e.g., four samples with four samples per symbol).

In FIG. 5, phase corrector tracker 40 includes Cartesian to polar transformer 42 (similar to Cartesian to polar transformer 22 in FIG. 3), divider 44, sector tracker 46, and polar to Cartesian transformer 48 (similar to the polar to Cartesian transformer 26, 28 of FIG. 3). Divider circuit 44 merely divides the phase input thereto (i.e., $\phi_{AVG}'$) by M to provide the signal input to the sector tracker.

Divider 44 restores the phase value that was multiplied in multiplier 24 of FIG. 3; however, the range over which the phase output of divider 44 may vary is limited to $360°\div M$. In order to ensure correct restoration of the average phase, sector tracker 46 adds or subtracts a phase angle defined by $360°\div M$ whenever it detects that the phase output of divider 44 jumps sharply. The output of sector tracker 46 is then converted to Cartesian coordinates in transformer 48.

The output of block phase estimator 50 (FIG. 6) contains Cartesian values for I, Q with the modulation removed but averaged over the averaging interval (e.g., 4 symbols). The output of block phase estimator 50 is estimated reference signals $I_{EST}$, $Q_{EST}$. In order to best provide for detection of signals against this average, it is necessary to delay those signals. Signals $I_i$, $Q_i$ are delayed in delay circuits 52 to provide delayed signals $I_{DEL}$, $Q_{DEL}$. The delay duration can be chosen to use prior symbols, post symbols, or a combination of both. De-rotator 54 is a full complex by complex multiplier to form the product of delayed incoming data signal $I_{DEL}$, $Q_{DEL}$ with reference signal $I_{EST}$, $Q_{EST}$. The output of de-rotator 54 is passed to decision devices 56. The in-phase decision device output value indicates whether the voltage being detected is in the left or right half plane of the plane depicted in FIG. 2, and the quadrature decision device output value indicates whether the voltage being detected is in the upper or lower half plane of FIG. 2. Decision devices 56 may include two comparators to determine which half plane the I value is in and which half plane the Q value is in.

SUMMARY OF THE INVENTION

It is an object to the present invention to achieve phase averaging while avoiding a need to convert polar formatted data into Cartesian formatted data and back again.

These and other objects are achieved in a block phase estimator that includes a phase averaging circuit. A first embodiment of the phase averaging circuit includes a phase differencing circuit coupled to an averager input, a first modulo circuit coupled to the phase differencing circuit, a filter coupled to the first modulo circuit, and a summation circuit having an positive input and a negative input, the positive input being coupled to the averager input, the negative input being coupled to the filter. The phase averaging circuit further includes a second modulo circuit coupled to the summation circuit.

An alternative embodiment of the phase averaging circuit includes a delay line having a plurality of taps coupled to an averager input and a plurality of first subtractor circuits, a first input of each first subtractor circuit being coupled to the averager input, a second input of each first subtractor circuit being coupled to a corresponding tap of the plurality of taps. A plurality of first modulo circuits are coupled to the plurality of first subtractor circuits, each first modulo circuit being coupled to a corresponding first subtractor circuit. A summation circuit is coupled to all first modulo circuits, and a scaling circuit is coupled to the summation circuit. The phase averaging circuit further includes a second subtractor circuit, a first input of the second subtractor circuit being coupled to the averager input, a second input of the second subtractor circuit being coupled to the scaling circuit.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The output of the arctangent transformation of a vector is the phase of the vector. The phase lies between $-\pi$ and $+\pi$ radians. There is a discontinuity at $\pi$ radians and $-\pi$ radians; although these two phase angles are identical.

An operation like averaging two phase angles is likely to produce an inaccurate result because of this discontinuity. For example, an average of two vectors whose phase angles are $\pi-\epsilon$ radians and $-\pi+\epsilon$ radians is a vector whose phase angle is $\pi$ radians; however, a strict averaging of phases of these two vectors whose phase angles are $\pi-\epsilon$ radians and $-\pi+\epsilon$ radians would inaccurately indicate a vector whose angle is zero. Thus, construction of a phase averager (in contrast to a vector averager discussed with respect to FIGS. 3–7) for a block phase estimator has not met with success.

The present invention provides a phase averager to average the phase over N data samples (N outputs of digital receiver 10) that successfully "unwraps the phase" in a modulo circuit. In the present phase averager, one of the N samples is chosen as a reference, and for each of the other N−1 data samples, a phase difference with respect to the phase of the reference sample is determined. If the phase difference is not equal to a phase within the domain limits defined between −π and +π radians, the phase is adjusted. If the phase difference is greater than π radians but less than 3π radians, then 2π radians is subtracted from the phase difference so that the phase difference is redefined within the domain limits defined between −π and +π radians. If the phase difference is less than −π radians but greater than −3π radians, then 2π radians is added to the phase difference so that the phase difference is redefined within the domain limits defined between −π and +π radians. Then all N−1 phase differences are averaged using non-saturating arithmetic.

For example, if the sampled phase is π−ε radians and the reference phase is −π+ε radians, then the phase difference is −2π+2ε radians. This phase difference is always less than π radians when ε<π/2 radians. Accordingly, 2π radians is added and the resulting unwrapped phase difference is 2ε radians. This is the correct answer for subtracting phase angle π−ε radians from −π+ε radians.

Figure 1:
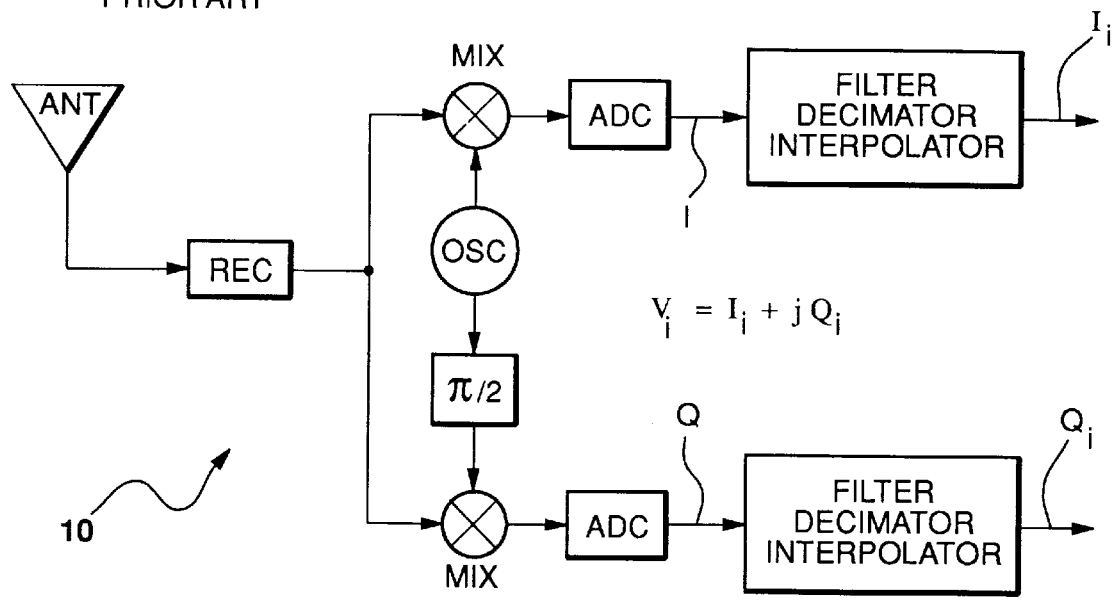
FIG. 1 is a block diagram of a conventional digital receiver.

A frequency error signal is a signal with a frequency equal to a difference between the carrier signal and the local oscillator signal (e.g., OSC in FIG. 1). The frequency error signal is assumed to be characterized by a frequency small enough that the phase change in the frequency error signal between adjacent symbols after modulation is removed is less than π/8 radians in QPSK signals and π/4 radians in BPSK signals. For 8-PSK signals the phase change between symbols is less than π/16 radians. With only a small frequency error relative to the symbol rate, the phase of the incoming carrier can be correctly unwrapped and averaged.

A modulo circuit unwraps the phase output from a phase differencer so that an operative phase averager may be constructed from one or more phase differencers.

The phases of successive samples, indexed by i, are represented by $\theta_i$. A uniformly weighted moving average over N samples, for example N=4, ending with the sample $\theta_n$ (i.e., ending when i=n) is given by:

$$\theta_{AV}(n) = h_0 \theta_n + h_1 \theta_{n-1} + h_2 \theta_{n-2} + h_3 \theta_{n-3}, \tag{1}$$

where $h_0 = h_1 = h_2 = h_3 = \frac{1}{4}$. The modulo circuit unwraps phase angles output from a differencer circuit; therefore, the average is re-expressed in terms of difference angles as follows:

$$\theta_{AV}(n) = A_0 \theta_n + A_1(\theta_n - \theta_{n-1}) + A_2(\theta_n - \theta_{n-2}) + A_3(\theta_n - \theta_{n-3}), \tag{2}$$

which may be rearranged as:

$$\theta_{AV}(n) = (A_0 + A_1 + A_2 + A_3)\theta_n + A_1 \theta_{n-1} + A_2 \theta_{n-2} + A_3 \theta_{n-3}, \tag{3}$$

where $(A_0 + A_1 + A_2 + A_3) = h_0$, $A_1 = -h_1$, $A_2 = -h_2$, and $A_3 = -h_3$. Thus, a phase average over four phase samples may be constructed using three phase differencers where $A_0 = 1$, $A_1 = -\frac{1}{4}$, $A_2 = -\frac{1}{4}$, and $A_3 = -\frac{1}{4}$.

Alternatively, a phase difference between the phase of each phase sample and the immediately preceding phase sample may be calculated. Then, the average phase may be expressed as:

$$\theta_{AV}(n) = A_0 \theta_n A_1(\theta_n - \theta_{n-1}) + A_2(\theta_{n-1} - \theta_{n-2}) + A_3(\theta_{n-2} - \theta_{n-3}), \tag{4}$$

which may be rearranged as:

$$\theta_{AV}(n) = (A_0 + A_1)\theta_n + (A_2 - A_1)\theta_{n-1} + (A_3 - A_2)\theta_{n-2} + A_3 \theta_{n-3}, \tag{5}$$

where $(A_0 + A_1) = h_0$, $(A_2 - A_1) = h_1$, $(A_3 + A_2) = h_2$, and $A_3 = -h_3$. Next, solve for the coefficients A based on the uniform weighting criteria discussed with respect to equation (1) so that $A_0 = h_0 + h_1 + h_2 + h_3$, $A_1 = -h_1 - h_2 - h_3$, $A_2 = -h_2 - h_3$, and $A_3 = -h_3$. Thus, a phase average over four phase samples may be constructed using a single phase differencer operated sequentially where $A_0 = 1$, $A_1 = -\frac{3}{4}$, $A_2 = -\frac{1}{2}$, and $A_3 = -\frac{1}{4}$.

A weighted phase average over N phase samples may in general be computed according to equation (1) based on a weighting vector given by:

$$H = [h_0, \ldots h_{N-1}]. \tag{6}$$

From this weighting vector, coefficients A may be determined. In one embodiment, generally described by equation (2), the coefficients A are determined by:

$$A_0 = \sum_{n=0}^{N-1} h_n \tag{7}$$

$$A_k = -h_k \tag{8}$$

for $1 \leq k \leq N-1$.

In another embodiment generally described by equation (4) the coefficients A are determined by:

$$A_0 = \sum_{n=0}^{N-1} h_n \tag{9}$$

$$A_k = \sum_{n=k}^{N-1} h_n \tag{10}$$

for $1 \leq k \leq N-1$.

Based on a modulo circuit and phase differencers, it is possible to eliminate the need to transform to Cartesian coordinates to perform averaging.

Figure 3:
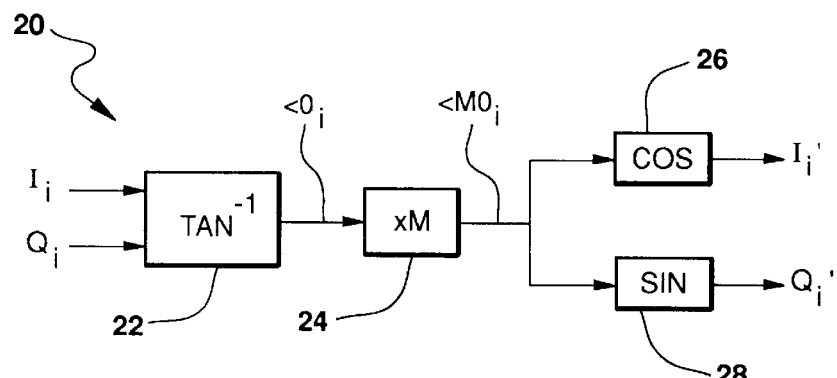
FIG. 3 is a block diagram depicting a convention modulation removal circuit.
Figure 4:
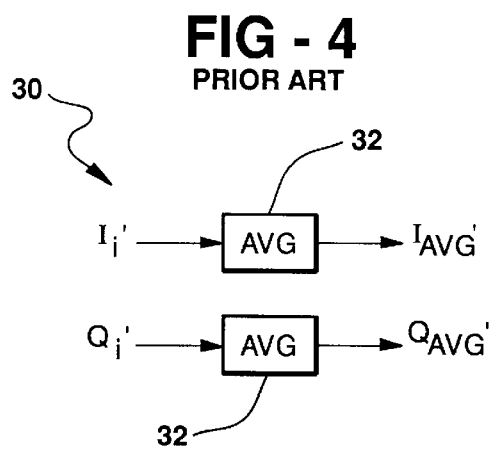
FIG. 4 is a block diagram depicting a conventional averager.
Figure 7:
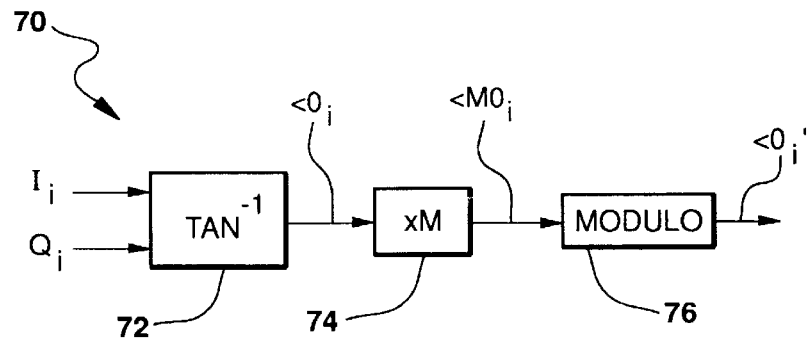
FIG. 7 is a block diagram depicting a modulation removal circuit according the present invention.

In FIG. 7, modulation removal circuit 70 includes Cartesian to polar transformer 72 and multiplier 74 that serve a substantially similar function to transformer 22 and multiplier 24 of FIG. 3; however, the amplitude of the polar phasor is not transformed. Unlike conventional circuits, modulation removal circuit 70 includes modulo circuit 76 to re-express the phase angle $\phi_i'$ in a range −π to +π radians. The modulo circuit determines the unwrapped phase as follows, $$\theta_{OUT} = \theta_{IN} - 2\pi * INT((\theta_{IN} + SIGN(\theta_{IN})*\pi)/2\pi),$$

where INT is the integer function and SIGN is the sign function. Modulation removal circuit 70 processes only the phase angle, there is no need to process the amplitude (i.e., the square root of $I_i^2$ and $Q_i^2$).

Figure 8:
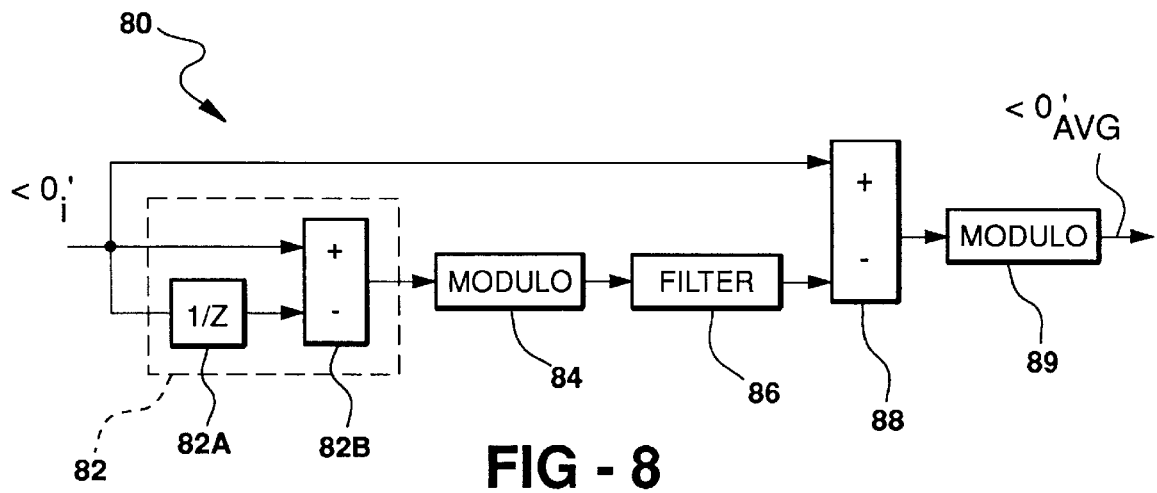
FIG. 8 is a block diagram depicting an averager circuit according to the present invention.

In FIG. 8, averager 80 includes differencer 82 coupled to modulo circuit 84 coupled to filter 86. Substractor 88 forms a difference between the input phase angle $\phi_i$ and the output of filter 86. The output of subtractor 88 is coupled to modulo circuit 89. Differencer 82 includes delay element 82A and substractor 82B. Delay element 82A merely delays the input phase angle $\phi_i'$ by one sample time. Filter 86 is preferably a transversal filter described with respect to FIG. 13. Substractor 88 subtracts the output of filter 86 from the input phase angle $\phi_i'$.

Figure 5:
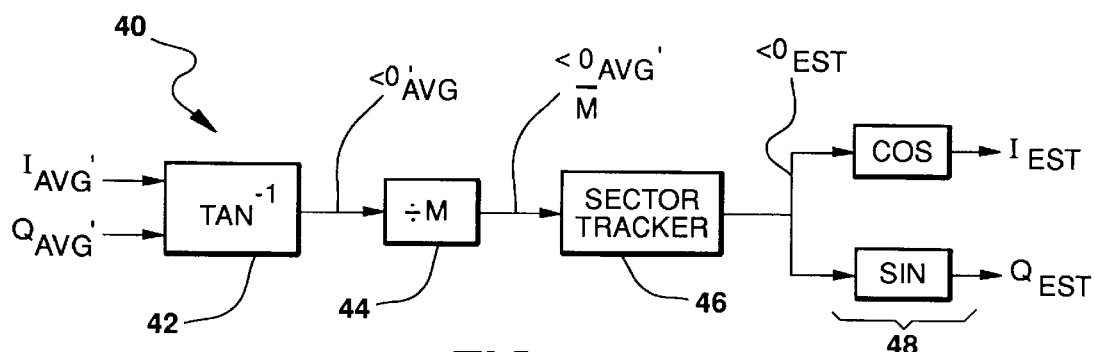
FIG. 5 is a block diagram depicting a conventional phase corrector tracker.
Figure 6:
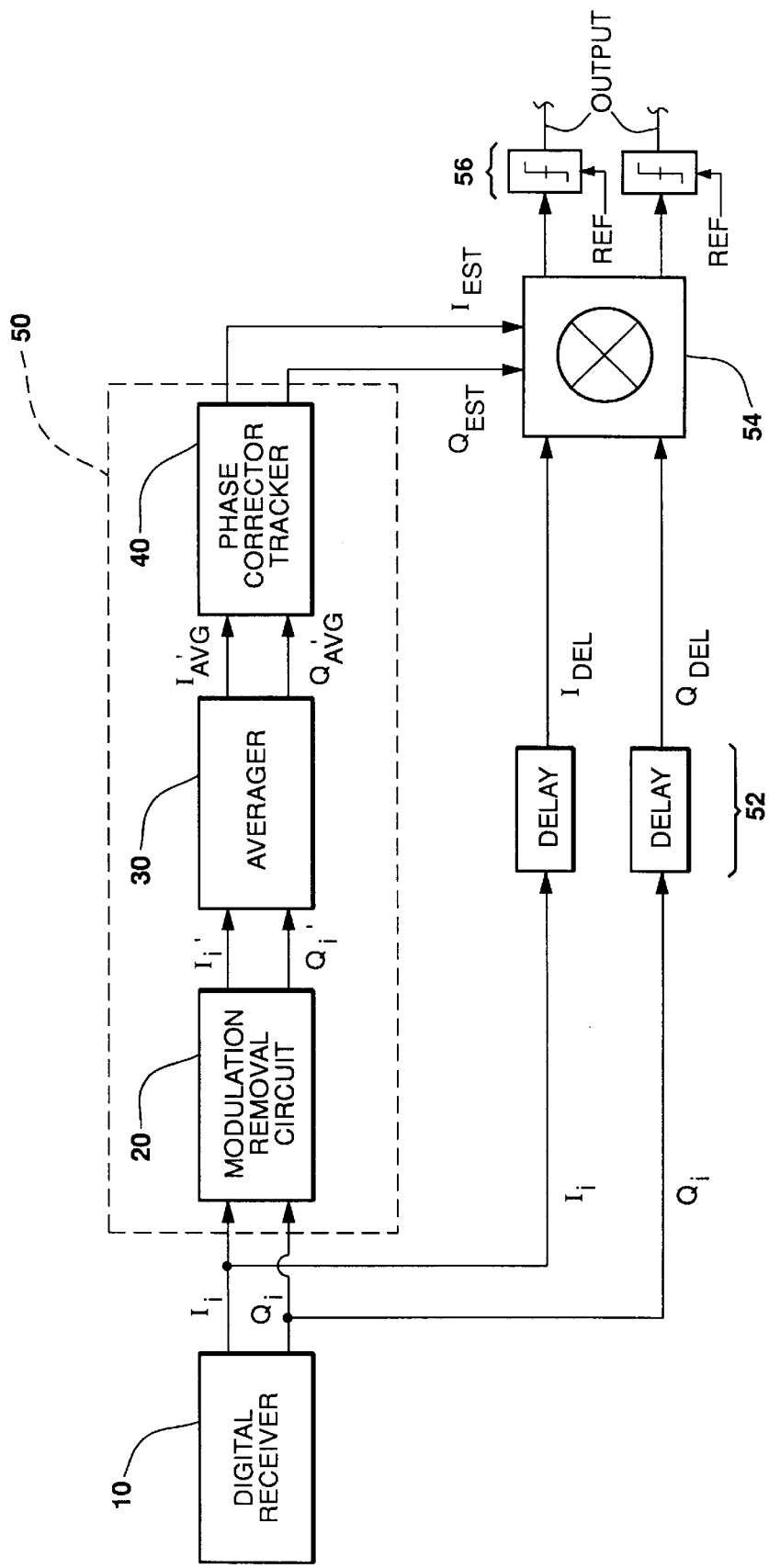
FIG. 6 is a block diagram depicting a conventional PSK decoder using a block phase estimator.
Figure 9:
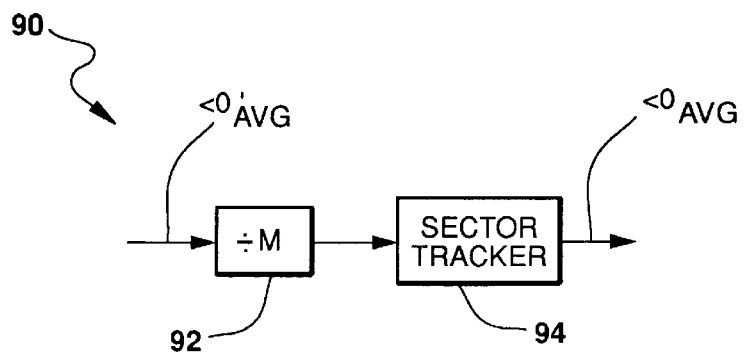
FIG. 9 is a block diagram depicting a phase corrector tracker according to the present invention.

In FIG. 9, phase corrector tracker 90 includes divider 92 and sector tracker 94 whose functions correspond to divider 44 and sector tracker 46 of FIG. 5 except that only phase angle is divided and tracked. However, it should be noted that in the present invention there is no need for Cartesian to polar transformer 42 and polar to Cartesian transformer 48 as depicted in FIG. 5. Similarly it should be noted that cosine and sine transformers 26, 28 of FIG. 3 are unnecessary in the present invention.

Figure 10:
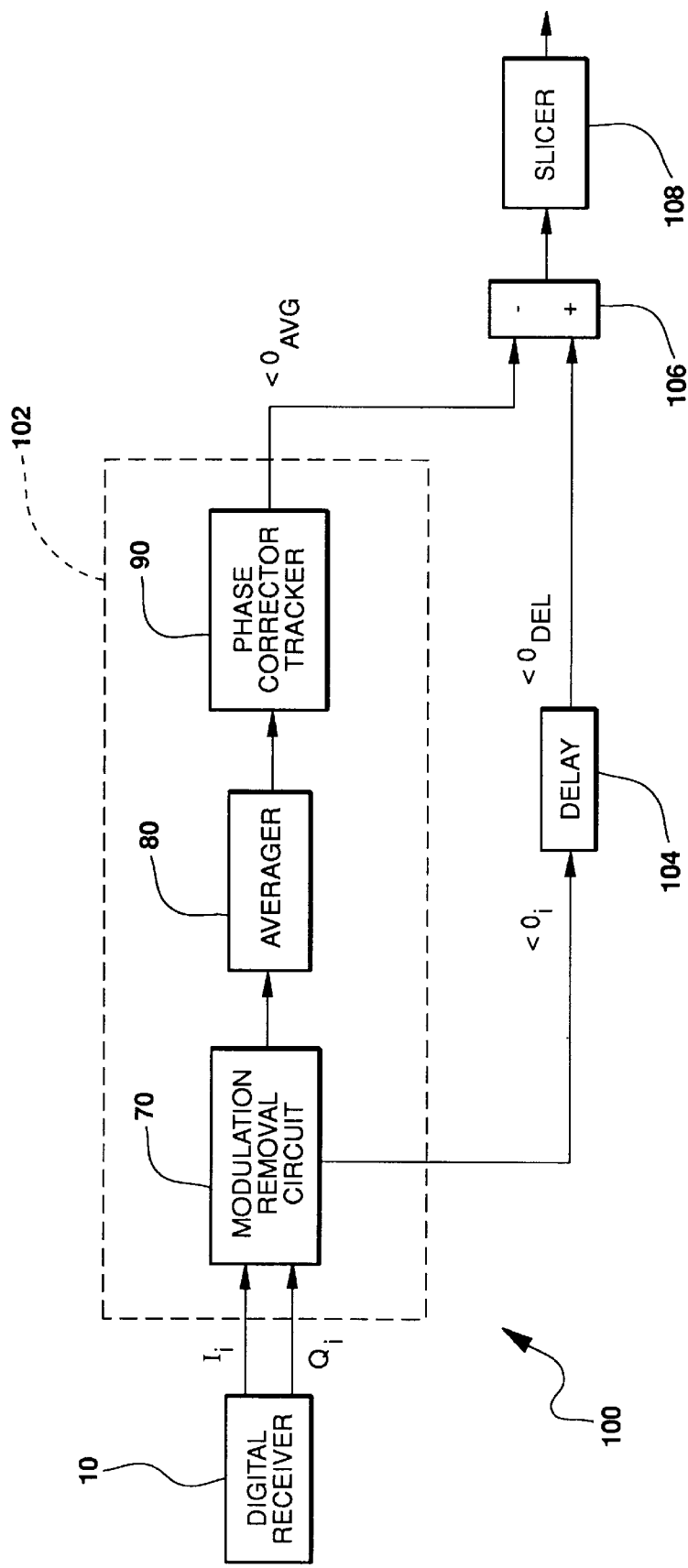
FIG. 10 is a block diagram depicting a decoder according to the present invention.

In FIG. 10, decoder 100 includes conventional digital receiver 10 coupled to block phase estimator 102 according to the present invention. Block phase estimator 102 includes rectangular to polar transformer and modulation removal circuit 70 (FIG. 7), phase averager 80 (FIG. 8), and phase corrector tracker 90 (FIG. 9). Modulation removal circuit 70 provides output phase signal $\phi_i$ to delay circuit 104. Phase angle $\phi_i$ is provided by modulation removal circuit 70 as an output from Cartesian to polar transformer 72 (FIG. 7). Differencer 106 subtracts the average phase angle $\phi_{AVG}$ from delayed phase signal $\phi_{DEL}$. The average phase angle from block phase estimator 102 is an average over a predetermined duration and the averaged output is available at the end of the averaging time duration. The delay provided by delay circuit 104 is preferably one-half the time duration over which the phase average $\phi_{AVG}$ is determined. The phase difference output from differencer 106 is provided to slicer 108. This phase difference output is a number representing a phase that varies between −180° and +180°. To this end, differencer 106 may include a modulo circuit.

Figure 2:
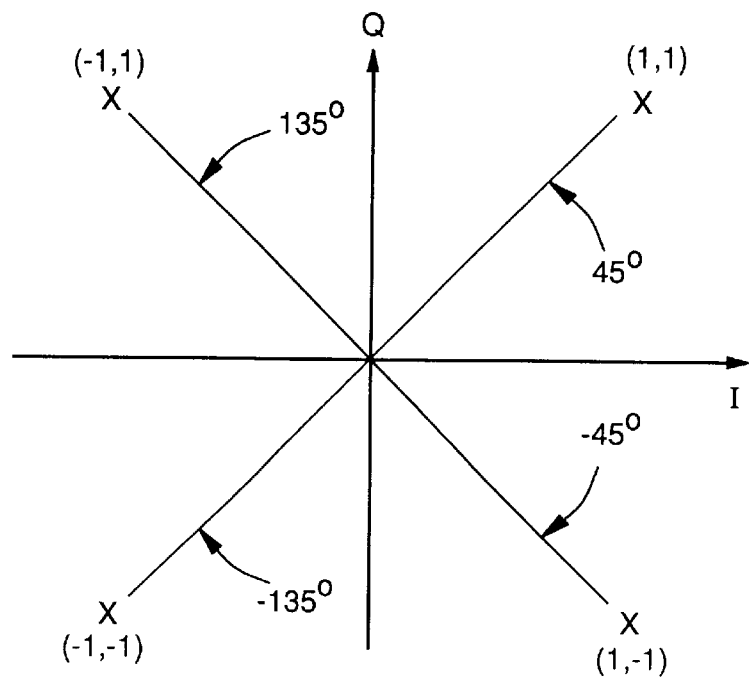
FIG. 2 is a graph of the complex I,Q plane depicting locations representative of four possible voltages that characterize a received QPSK signal.

To understand the operation of slicer 108, refer to FIG. 2. In the case of QPSK, there are four possible values depicted in four separate quadrants. The input to slicer 108 is a phase angle referenced to the I axis of FIG. 2. The slicer includes a series of comparators to determine where the phase angle is greater than 0 but less than 90° (i.e., first quadrant), greater than 90° but less than 180° (i.e., second quadrant), greater than −180° but less than −90° (i.e., third quadrant) or between 0 and −90° (i.e., fourth quadrant). When the quadrant is identified, the symbol value has been determined.

Figure 11:
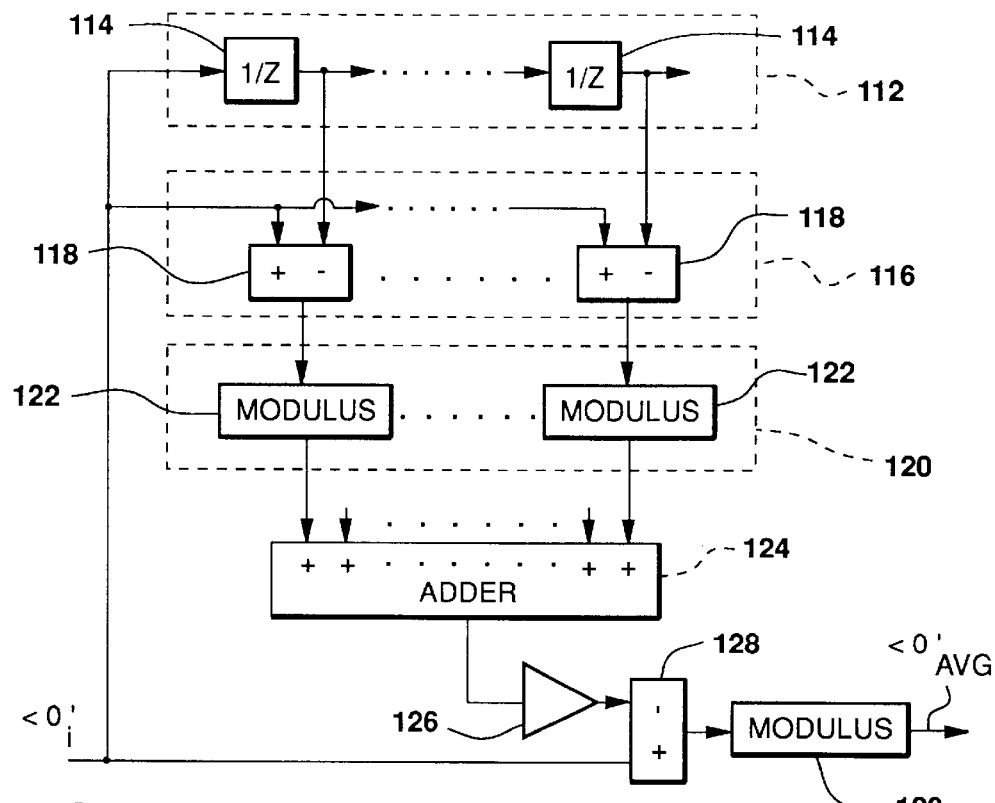
FIG. 11 is a block diagram depicting an alternative embodiment of an averager according to the present invention.

In FIG. 11, averager 110 is depicted as an alternative embodiment to averager 80 of FIG. 8. Averager 110 includes tapped delay line 112, parallel substractor 116, parallel modulo circuit 120, parallel adder 124, scaling circuit 126, substractor 128 and modulo circuit 129. Tapped delay line 112 includes a plurality delay elements 114. Each delay element delays its input by one symbol interval. For example, if the analog to digital conversion rate (FIG. 1) is four times the symbol rate, the decimator (FIG. 1) down samples 4:1 so tapped delay line 112 receives samples at the symbol rate. Delay line 112 may preferably include eight delay elements 114 so that similarly, parallel substractor 116 will preferably include eight subtractors 118, and parallel modulo circuits 120 will preferably include eight modulo circuits 122. Parallel adder 124 adds all outputs from the modulo circuits included in parallel modulo circuit 120. Scaling circuit 126 determines the average of the outputs of all modulo circuits 122 of parallel modulo circuit 120. For example, if there are eight modulo circuits 122, parallel adder 124 will add all eight output values and scaler circuit 126 will divide the output of parallel adder 124 by eight. It will be appreciated that a divide by eight in a digital computer maybe accomplished by shifting. Substractor 128 and modulo circuit 129 serve the same function as, and are substantially the same as, substractor 88 and modulo circuit 89 of FIG. 8.

Figure 12:
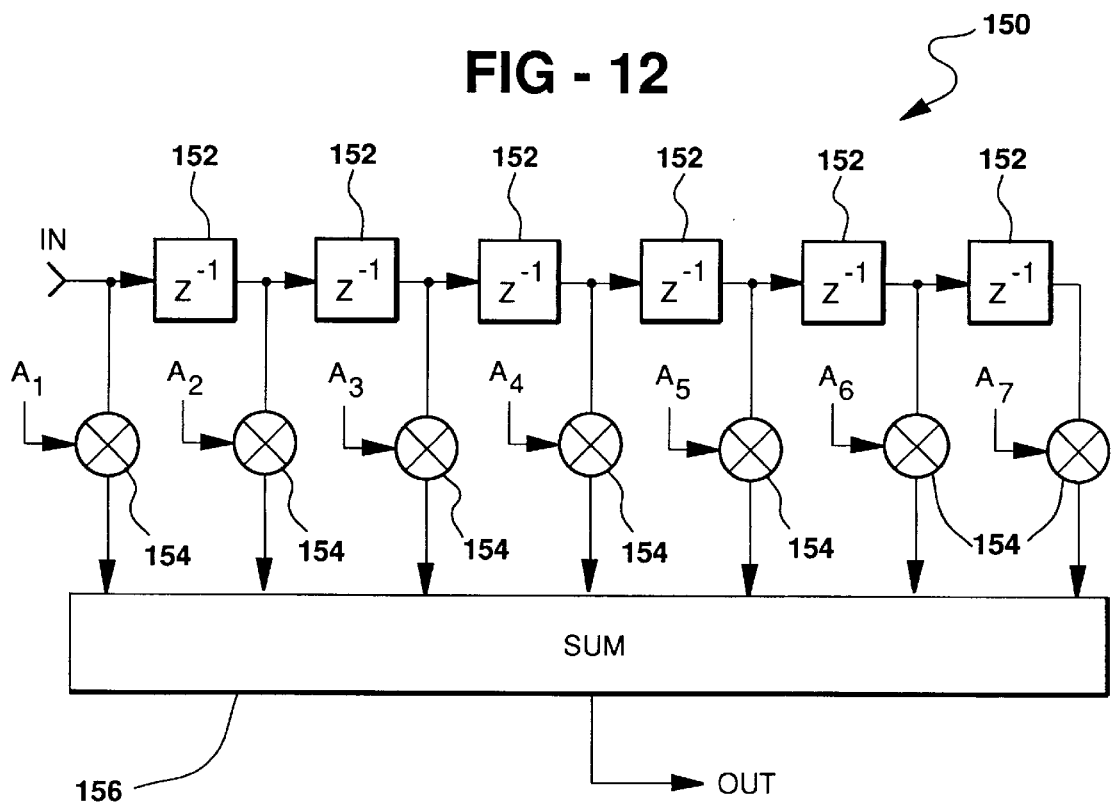
FIG. 12 is a block diagram of a filter according to the present invention.

In FIG. 12, filter 150 includes a taped delay line comprised of a plurality of delay line elements 152. Each tap is provided to a first input of respective multiplier 154. A second input of each multiplier 154 is provided with one of coefficients A as determined by equation (10) above. The outputs of all multipliers 154 are provided as inputs to summation circuit 156. Filter 150 is a transversal filter with a finite impulse response function. Such a filter is advantageously employed as filter 86 (FIG. 8).

The present invention may be implemented in a current desk top computer under control of a program that mechanizes the functions described herein. The present invention maybe implemented in special hardware logic and arithmetic circuits. The present invention may be implemented in special applications specific integrated circuits (ASICs). The present invention may be implemented in customized gate array circuits. The present invention may be implemented in programmable digital signal processor integrated circuits.

Figure 13:
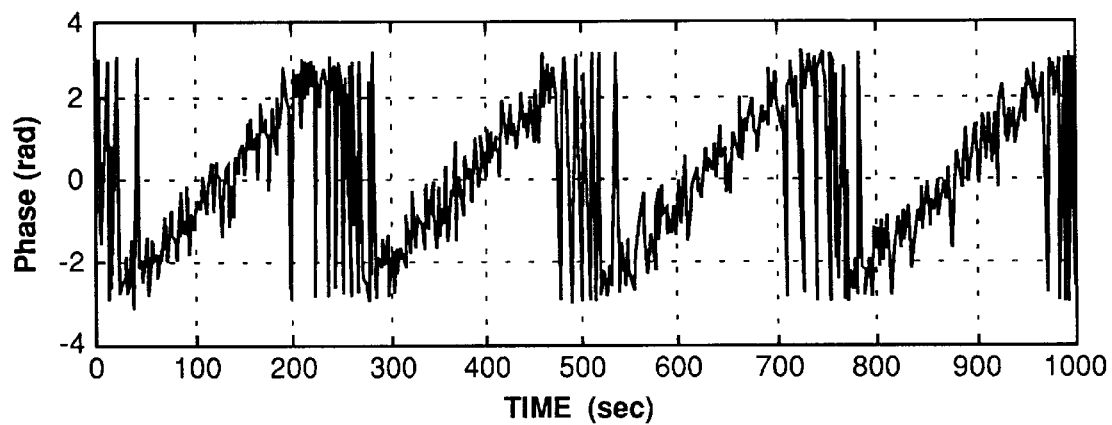
FIG. 13 is a graph depicting unaveraged phase to be simulated.
Figure 14:
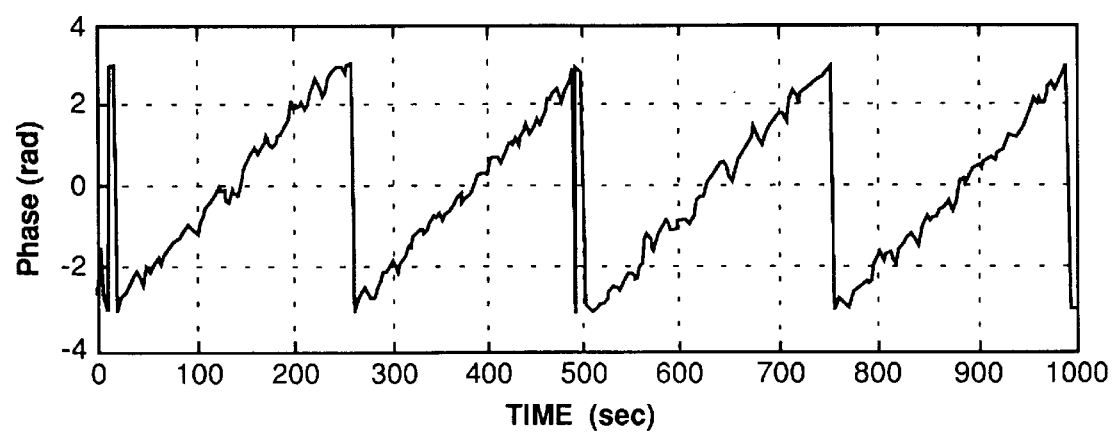
FIG. 14 is a graph depicting averaged phase from a simulated known averager.
Figure 15:
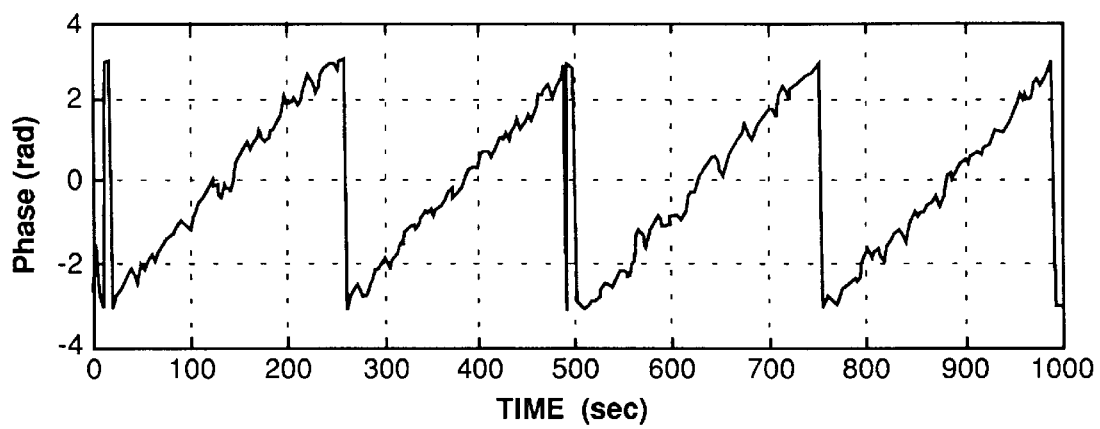
FIG. 15 is a graph depicting averaged phase from a simulated phase averager according to and embodiment of the present invention.
Figure 16:
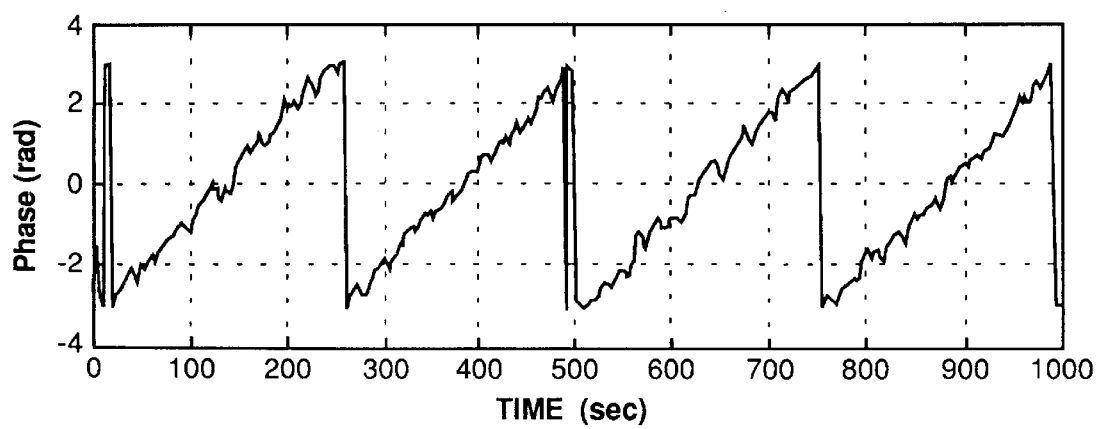
FIG. 16 is a graph depicting averaged phase from a simulated phase averager according to another embodiment of the present invention.

These circuits have been simulated using quadrature PSK modulation, a 15 dB signal to noise ratio and a frequency offset between transmitted carrier and receiver oscillator of 0.001 Hz. The simulation symbol rate was normalized to 1 Hz and 8 samples were taken over a symbol duration. A times four multiplier (24 of FIG. 3 and 74 of FIG. 7) was applied after the arctangent transformation (22 of FIG. 3 and 72 of FIG. 7) to remove the quadrature PSK modulation. A times two multiplier would be used for binary PSK modulation, and a times 8 multiplier would be used for 8-PSK modulation, etc. FIG. 13 depicts the phase without averaging. FIG. 14 depicts the averaged phase using a known Cartesian based averager (e.g., FIGS. 3–6). FIG. 15 depicts the averaged phase using the phase averager of equation (4), i.e, FIG. 8. FIG. 16 depicts the averaged phase using the phase averager of equation (2), i.e., FIG. 11. FIGS. 14–16 illustrate that the present invention achieves the same phase average performance as as known averagers without the need to provide a means for converting back and forth between Cartesian and polar coordinates.

Having described preferred embodiments of a novel block phase estimator (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims:

What is claimed is:

1. In a phase estimator, a phase averaging circuit comprising:
   a phase differencing circuit coupled to an averager input;
   a first modulo circuit coupled to the phase differencing circuit;
   a filter coupled to the first modulo circuit; and
   a summation circuit having an positive input and a negative input, the positive input being coupled to the averager input, the negative input being coupled to the filter.

2. The circuit of claim 1, further comprising a second modulo circuit coupled to the summation circuit.

3. The circuit of claim 1, wherein the filter comprises:
   a delay line having a plurality of taps;
   a plurality of multipliers, each multiplier having first and second inputs, the first input of each multiplier being coupled to a corresponding tap, a predetermined filter coefficient being provided to the second input of each multiplier; and
   a filter summer being coupled to an output of each multiplier.

4. The circuit of claim 3, wherein:

a number of samples to be averaged is N;

a number of multipliers is N−1;

each multiplier is identified by an index k where k is greater than zero and k is less than or equal to N;

a uniformly weighted phase average is sought where $h_n$ is an inverse of N; and the predetermined filter coefficient provided to the kth multiplier is $A_k$ and is given by:

$$\left[ A_k = \sum_{n=k}^{N-1} h_{(n)} \right].$$

5. In a phase estimator, a method of feed forward phase averaging comprising steps of:

receiving a signal with a plurality of samples, each with an associated phase:

forming a phase difference measurement between a current phase measurement of a selected sample and an adjacent phase measurement of a sample adjacent to the selected sample;

transforming the phase difference measurement into a differenced phase measurement between −π and π radians;

filtering the differenced phase measurement; and forming a subtracted phase by subtracting the differenced phase measurement from the current phase measurement.

6. The method of claim 5, further comprising a step of transforming the subtracted phase into a phase between −π and π radians.

7. The method of claim 5, wherein the step of filtering comprises steps of:

forming a plurality of adjacent phase measurements;

separately multiplying each adjacent phase measurement by a corresponding predetermined filter coefficient; and a summing all multiplication results.

8. The method of claim 7, wherein:

a number of phase measurements to be averaged is N;

a number of adjacent phase measurements is N−1;

each predetermined filter coefficient is identified by an index k where k is greater than zero and k is less than or equal to N;

a uniformly weighted phase average is sought where $h_n$ is an inverse of N; and the $k^{th}$ predetermined filter coefficient is $A_k$ and is given by:

$$A_k = \sum_{n=k}^{N-1} h_n.$$

9. In a phase estimator, a phase averaging circuit comprising:

a delay line having a plurality of taps coupled to an averager input;

a plurality of first subtractor circuits, a first input of each first subtractor circuit being coupled to the averager input, a second input of each first subtractor circuit being coupled to a corresponding tap of the plurality of taps;

a plurality of first modulo circuits, each first modulo circuit being coupled to a corresponding first subtractor circuit;

a summation circuit coupled to all first modulo circuits;

a scaling circuit coupled to the summation circuit; and a second subtractor circuit, a first input of the second subtractor circuit being coupled to the averager input, a second input of the second subtractor circuit being coupled to the scaling circuit.

10. The circuit of claim 9, further comprising a second modulo circuit coupled to the second subtractor circuit.

11. The circuit of claim 9, wherein the scaling circuit multiplies an input to be scaled by an inverse of a number of samples to be averaged.

12. The circuit of claim 9, wherein:

a modulation carrier has a period T; and the delay line includes at least four taps representing phases sampled during the period T.

13. In a phase estimator, a method of feed forward phase averaging comprising steps of:

receiving a signal with a plurality of samples, each with an associated phase:

forming a plurality of adjacent phase measurements;

forming a plurality of first subtracted phase measurements by subtracting each adjacent phase measurement from a current phase measurement the current phase being selected from the plurality of adjacent phases;

forming a plurality of first modulo phases by transforming each first subtracted phase measurement into a phase between −π and π radians;

forming a summed phase measurement by summing all first modulo phases;

scaling the summed phase measurement; and forming a second subtracted phase measurement by subtracting the scaled phase measurement from the current phase measurement.

14. The method of claim 13, further comprising an additional step of transforming the second subtracted phase measurement into a phase between −π and π radians.

15. The method of claim 13, wherein the step of scaling multiplies an input to be scaled by an inverse of a number of samples to be averaged.

* * * * *